(12) United States Patent
Pan et al.

(10) Patent No.: US 9,059,107 B2
(45) Date of Patent: Jun. 16, 2015

(54) PACKAGING METHODS AND PACKAGED DEVICES

(75) Inventors: Kuo Lung Pan, Hsin-Chu (TW); Ming Hung Tseng, Toufen Township (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/612,588

(22) Filed: Sep. 12, 2012

(65) Prior Publication Data

US 2014/0070403 A1    Mar. 13, 2014

(51) Int. Cl.
| | |
|---|---|
| *H01L 23/498* | (2006.01) |
| *H01L 21/56* | (2006.01) |
| *H01L 23/31* | (2006.01) |
| *H01L 21/48* | (2006.01) |
| *H01L 23/00* | (2006.01) |
| *H01L 21/683* | (2006.01) |
| *H01L 25/10* | (2006.01) |
| *H01L 25/00* | (2006.01) |
| *H01L 23/538* | (2006.01) |

(52) U.S. Cl.
CPC ............ *H01L 23/3121* (2013.01); *H01L 21/56* (2013.01); *H01L 2224/12105* (2013.01); *H01L 2224/32225* (2013.01); *H01L 2224/73267* (2013.01); *H01L 2224/92244* (2013.01); *H01L 2225/1035* (2013.01); *H01L 2225/1058* (2013.01); *H01L 2924/15311* (2013.01); *H01L 2224/83005* (2013.01); *H01L 21/4846* (2013.01); *H01L 24/19* (2013.01); *H01L 24/20* (2013.01); *H01L 21/6835* (2013.01); *H01L 25/105* (2013.01); *H01L 25/50* (2013.01); *H01L 2224/73253* (2013.01); *H01L 2224/131* (2013.01); *H01L 2224/2919* (2013.01); *H01L 23/49827* (2013.01); *H01L 23/5389* (2013.01)

(58) Field of Classification Search
CPC ................. H01L 2225/06548; H01L 23/5384; H01L 23/28; H01L 23/3157; H01L 24/18; H01L 2224/023; H01L 2224/0233; H01L 2224/03001; H01L 2224/03003; H01L 2224/03002; H01L 2224/821; H01L 21/76898; H01L 23/538
USPC .......... 257/621, 686, 734, 737, 774, E23.141, 257/E23.174, E23.178; 438/107, 108, 109, 438/667, 672, 675
See application file for complete search history.

(56) References Cited

U.S. PATENT DOCUMENTS

| | | | |
|---|---|---|---|
| 2007/0052086 A1* | 3/2007 | Oi et al. .......................... | 257/698 |
| 2007/0296065 A1* | 12/2007 | Yew et al. ...................... | 257/659 |
| 2009/0008762 A1* | 1/2009 | Jung .............................. | 257/686 |
| 2009/0239336 A1* | 9/2009 | Lee et al. ....................... | 438/107 |
| 2011/0291283 A1* | 12/2011 | Chi et al. ....................... | 257/773 |
| 2012/0104606 A1* | 5/2012 | Okuda et al. ................... | 257/738 |
| 2012/0153493 A1* | 6/2012 | Lee et al. ....................... | 257/774 |
| 2013/0037950 A1* | 2/2013 | Yu et al. ........................ | 257/738 |

* cited by examiner

*Primary Examiner* — Peniel M Gumedzoe
(74) *Attorney, Agent, or Firm* — Slater & Matsil, L.L.P.

(57) ABSTRACT

Packaging methods and packaged devices are disclosed. In one embodiment, a method of packaging a semiconductor device includes forming a first redistribution layer (RDL) over a carrier, and forming a plurality of through assembly vias (TAVs) over the first RDL. An integrated circuit die is coupled over the first RDL, and a molding compound is formed over the first RDL, the TAVs, and the integrated circuit die. A second RDL is formed over the molding compound, the TAVs, and the integrated circuit die.

20 Claims, 8 Drawing Sheets

PACKAGING METHODS AND PACKAGED DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Package on package (PoP) technology is becoming increasingly popular for its ability to allow for denser integration of integrated circuits into a small overall package. PoP technology is employed in many advanced handheld devices, such as smart phones and electronic tablets.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to methods and structures for packaging semiconductor devices. Novel PoP devices, packaged semiconductor devices, and packaging methods will be described herein, wherein a first redistribution layer (RDL) is first formed over a carrier, an integrated circuit die is attached to the first RDL, and a second RDL is then formed over the integrated circuit die.

Figure 1:
FIGS. 1 through 18 are cross-sectional views illustrating a method of packaging an integrated circuit die in accordance with an embodiment of the present disclosure.

FIGS. 1 through 18 are cross-sectional views illustrating a method of packaging an integrated circuit die 114 (see FIG. 9) in accordance with an embodiment of the present disclosure. Referring first to FIG. 1, a carrier 100 is provided. The carrier 100 comprises a wafer in some embodiments. The carrier 100 may comprise a semiconductor material or glass, as examples. Alternatively, the carrier 100 may comprise other materials.

Figure 2:
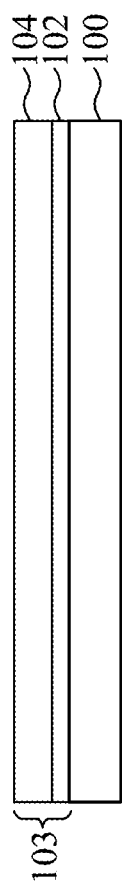

A first insulating material 103 is formed over the carrier 100, as shown in FIG. 2. The first insulating material 103 includes a first layer 102 disposed over the carrier 100 and a second layer 104 disposed over the first layer 102. The first layer 102 of the first insulating material 103 comprises a photosensitive material such as a light to heat conversion (LTHC) film having a thickness of about 1 µm, for example, although alternatively, the first layer 102 may comprise other materials and dimensions. The second layer 104 of the first insulating material 103 comprises an insulating material such as a polyimide, a polymer, polybenzoxazole (PBO), or multiple layers or combinations thereof, as examples. The second layer 104 has a thickness of about 5 to 10 µm, for example. Alternatively, the second layer 104 of the first insulating material 103 may comprise other materials and dimensions. The first layer 102 is not included in the first insulating material 103 in some embodiments.

Figure 3:
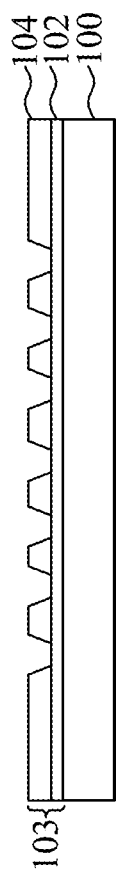

The first insulating material 103 is patterned using lithography, as shown in FIG. 3. If the first layer 102 is included in the first insulating material 103, the first layer 102 is not patterned in some embodiments. The patterned first insulating material 103 forms a portion of a first redistribution layer (RDL) (not labeled in FIGS. 3 through 17: see first RDL 132 shown in FIG. 18) for the package, to be described further herein. The patterns in the first insulating material 103 comprise openings in the first insulating material 103 in at least the second layer 104. In some embodiments, the first layer 102 is also patterned, not shown. The patterns in the first insulating material 103 are formed in a central region of the first insulating material 103. In some embodiments, the patterns in the first insulating material 103 are also formed in a perimeter region of the first insulating material 103, to be described further herein.

The first insulating material 103 is patterned using lithography in some embodiments by depositing a layer of photoresist (not shown) over the first insulating material 103, and exposing the layer of photoresist to light or energy reflected from or through a lithography mask having the desired pattern formed thereon. The layer of photoresist is developed, and portions of the layer of photoresist are ashed or etched away, leaving a patterned layer of photoresist on top of the first insulating material 103. The layer of photoresist is then used as an etch mask while exposed portions of the first insulating material 103 are etched away. The layer of photoresist is then removed.

Figure 4:
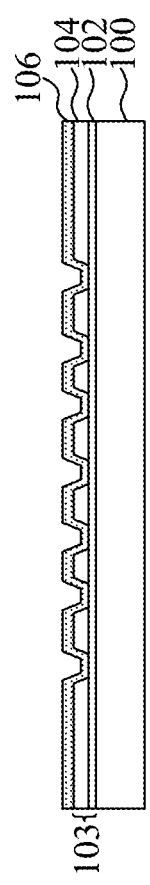

A first conductive material 106 is formed over the patterned first insulating material 103, as shown in FIG. 4. The first conductive material 106 comprises Cu, Al, other metals, or multiple layers or combinations thereof, for example. The first conductive material 106 comprises a thickness of about 4 to 7 µm, for example. Alternatively, the first conductive material 106 may comprise other materials and dimensions. The first conductive material 106 lines the patterns in the first insulating material 103. The first conductive material 106 is substantially conformal in some embodiments and evenly lines the top surface of the second layer 104 of the first insulating material 103, the exposed portions of the top surface of the first layer 102 of the first insulating material 103, and sidewalls of the patterns in the second layer 104 of the first insulating material 103, for example. In other embodiments, the first conductive material 106 may be non-conformal.

Figure 5:
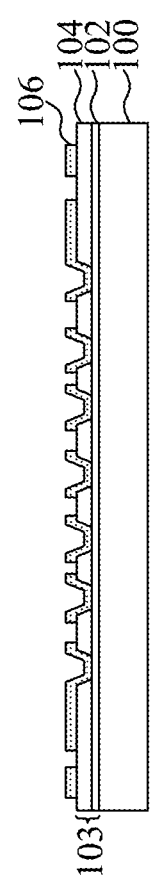

The first conductive material 106 is patterned using lithography (e.g., as described for the first insulating material 103, by forming a photoresist over the first conductive material 106, patterning the photoresist, and using the photoresist as an etch mask), as shown in FIG. 5. The first conductive material 106 comprises a portion of a first RDL 132 of the package. The first conductive material 106 lines the patterns in the first insulating material 103 in the central region of the first insulating material 103. The first conductive material 106 includes landing regions or contact pads over a perimeter region of the first insulating material 103. The first conductive material 106 may include fan-out regions of conductive lines that couple together the patterns in the central region with the landing regions or contact pads in the perimeter region in some embodiments, for example.

In the embodiment shown in FIGS. 1 through 18, the second layer 104 of the first insulating material 103 is patterned only in the central region, as shown in FIG. 3. Alternatively, the second layer 104 of the first insulating material 103 may also be patterned in the perimeter region to form external connections in the first RDL 132 in the perimeter region of the packaged device, as shown in FIG. 19.

Figure 6:
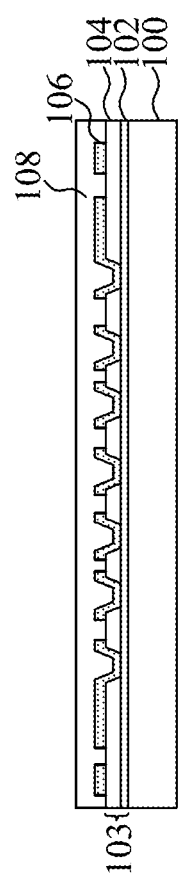

Referring next to FIG. 6, after the first conductive material 106 is patterned, a second insulating material 108 is formed over the patterned first conductive material 106 and the patterned first insulating material 103. The second insulating material 108 comprises a portion of the first RDL 132. The second insulating material 108 comprises a material and thickness similar to the material and thickness of the second layer 104 of the first insulating material 103 described herein, for example. Alternatively, the second insulating material 108 may comprise other materials and dimensions.

Figure 7:
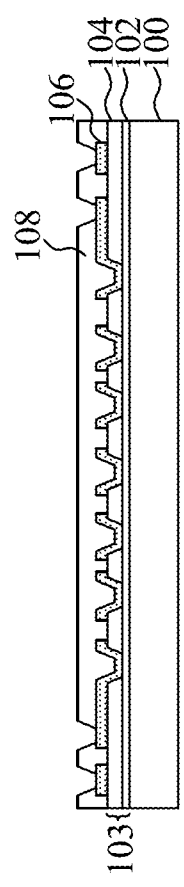

The second insulating material 108 is patterned using lithography, as shown in FIG. 7. The second insulating material 108 is patterned to expose portions of the first conductive material 106 in a perimeter region of the second insulating material 108. The exposed portions of the first conductive material 106 comprise landing regions or contact pads in some embodiments.

Figure 8:
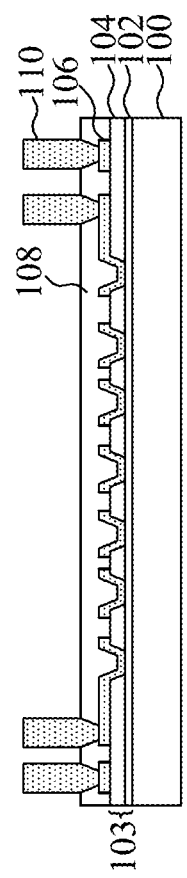

A plurality of through assembly vias (TAVs) 110 is formed over the exposed portions of the first conductive material 106 in the perimeter region of the second insulating material 108, as shown in FIG. 8. The TAVs 110 comprise Cu or a Cu alloy in some embodiments. The TAVs 110 comprise a width of about 60 to 90 µm and a height or thickness of about 100 to 120 µm, for example. Alternatively, the TAVs 110 may comprise other materials and dimensions. The TAVs 110 comprise a circular, oval, square, or rectangular shape in a top view in some embodiments. Alternatively, the TAVs 110 may comprise other shapes. The TAVs 110 are formed using a plating process in some embodiments. Alternatively, a conductive material may be deposited over the second insulating material 108 and patterned to form the TAVs 110, in other embodiments, for example.

Figure 9:
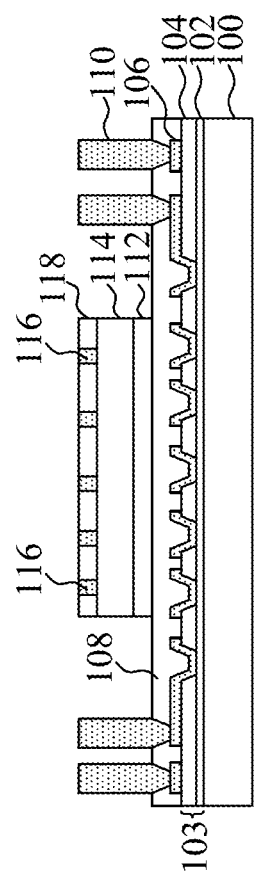

An integrated circuit die 114 is provided and is coupled to the first RDL, as shown in FIG. 9. The integrated circuit die 114 comprises semiconductor circuitry that may be formed over a semiconductor substrate comprising silicon or other semiconductor materials. The integrated circuit die 114 may include active components or circuits, not shown, that may comprise transistors, diodes, capacitors, inductors. The integrated circuit die 114 may comprise a memory device, a logic device, or other types of circuits, as examples.

The integrated circuit die 114 is coupled to a central region of the second insulating material 108. The integrated circuit die 114 is mounted face up with contacts 116 on a top surface thereof. The integrated circuit die 114 is coupled over the first RDL 132; e.g., over the second insulating material 108 of the first RDL 132. The integrated circuit die 114 is attached to the central region of the second insulating material 108 by a die attach film (DAF) or an adhesive 112. The integrated circuit die 114 includes a plurality of contacts 116 disposed in a third insulating material 118 formed on a top surface thereof. The contacts 116 comprise Cu, a Cu alloy, or other metals, as examples. The contacts 116 comprise plated vias in some embodiments. Alternatively, the contacts 116 may comprise other materials and may be formed using other methods. The third insulating material 118 comprises a material similar to the material of the second layer 104 of the first insulating material 103 in some embodiments. Alternatively, the third insulating material 118 may comprise other types of materials.

Figure 10:
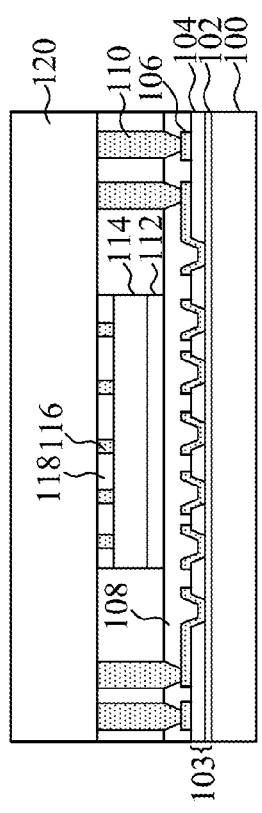
Figure 11:
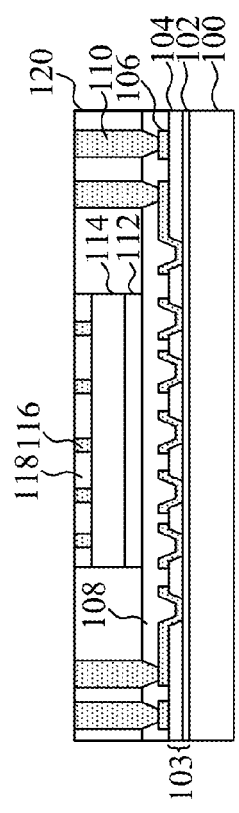

A molding compound 120 is formed over the first RDL 132; e.g., over a top surface of the second insulating material 108 of the first RDL 132, over the top surface of the TAVs 110, and over a top surface of the integrated circuit die 114, as shown in FIG. 10. The molding compound 120 comprises polyimide, epoxy, acrylate, or silica in some embodiments, as examples, although alternatively, the molding compound 120 may comprise other materials. The molding compound 120 is formed over the top surface of the TAVs 110 and over the top surface of the integrated circuit die 114 as initially deposited, as illustrated in FIG. 10. A chemical mechanical polishing (CMP) process, an etch process, or a combination thereof, is used to remove portions of the molding compound 120 from over the top surface of the TAVs 110 and from over the top surface of the integrated circuit die 114, as shown in FIG. 11. The molding compound 120 is disposed around the integrated circuit die 114, between the integrated circuit die 114 and the TAVs 110, and between the TAVs 110.

Figure 12:
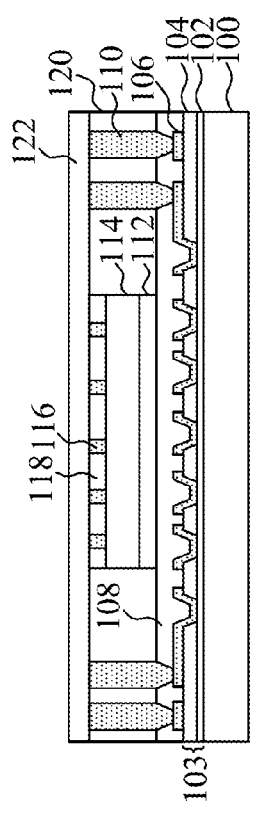

Next, a second RDL 134 (not labeled in FIGS. 12 through 17: see second RDL 134 shown in FIG. 18) is formed over the molding compound 120 and exposed top surfaces of the TAVs 110 and the integrated circuit 114. The second RDL 134 is formed by forming a fourth insulating material 122 over the molding compound 120, the TAVs 110, and the integrated circuit 114, as shown in FIG. 12. The fourth insulating material 122 is also referred to herein, e.g., in some of the claims, as a third insulating material. The fourth insulating material 122 comprises a similar material and thickness as the second layer 104 of the first insulating material 103 in some embodiments. Alternatively, the fourth insulating material 122 may comprise other materials and dimensions.

Figure 13:
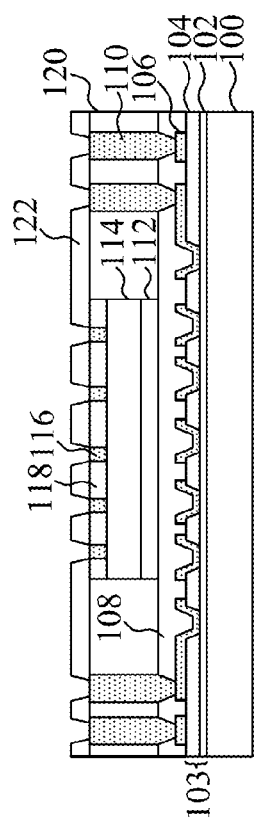

The fourth insulating material 122 is patterned using lithography, as shown in FIG. 13. The patterned fourth insulating material 122 forms a portion of the second RDL 134 for the package. The patterns in the fourth insulating material 122 comprise openings in the fourth insulating material 122 over the TAVs 110 and the contacts 116 of the integrated circuit die 114. The patterns in the fourth insulating material 122 are formed in a central region of the fourth insulating material 122 over the contacts 116 of the integrated circuit die 114. Patterning the fourth insulating material 122 comprises exposing the plurality of contacts 116 on the top surface of the integrated circuit die 114 in some embodiments, for example. The patterns in the fourth insulating material 122 are also formed in a perimeter region of the fourth insulating material 122 over the TAVs 110.

Figure 14:
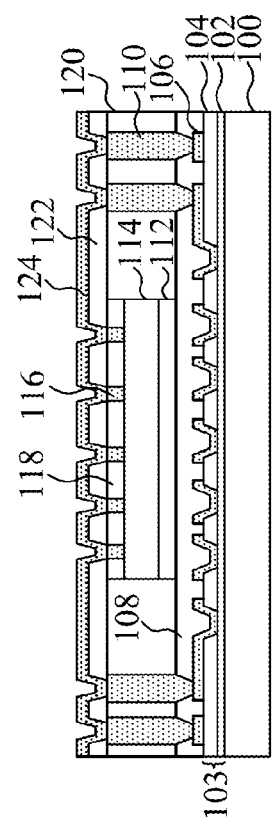

A second conductive material 124 is formed over the patterned fourth insulating material 122, as shown in FIG. 14. The second conductive material 124 comprises similar materials and dimensions as described for the first conductive material 106 in some embodiments. Alternatively, the second conductive material 124 may comprise other materials and dimensions. The second conductive material 124 lines the patterns in the fourth insulating material 122. The second conductive material 124 is substantially conformal in some embodiments and evenly lines the top surface of the fourth insulating material 122, the exposed portions of the TAVs 110, the exposed contacts 116 of the integrated circuit die 114, and sidewalls of the patterns in the fourth insulating material 122, for example. In other embodiments, the second conductive material 124 may be non-conformal.

Portions of the second conductive material 124 are coupled to the top surfaces of the plurality of contacts 116 on the top surface of the integrated circuit die 114. Portions of the second conductive material 124 are also coupled to the top surfaces of the TAVs 110.

Figure 15:
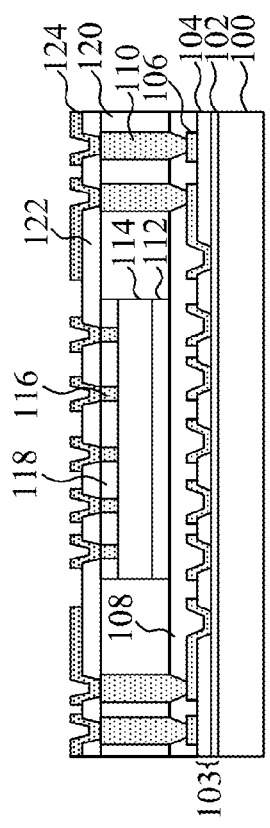

The second conductive material 124 is patterned using lithography, as shown in FIG. 15. The second conductive material 124 comprises a portion of the second RDL 134 of the package. The second conductive material 124 lines the patterns in the fourth insulating material 122 in the central region and the perimeter region of the fourth insulating material 122. The second conductive material 124 includes landing regions or contact pads over the perimeter region and the central region of the fourth insulating material 122. The second conductive material 124 may include fan-out regions of conductive lines that couple together the patterns in the central region with the landing regions or contact pads in the perimeter region in some embodiments, for example. The landing regions and/or contact pads of the second conductive material 124 may comprise an under-ball metallization (UBM) structure on some embodiments, as another example.

Figure 16:
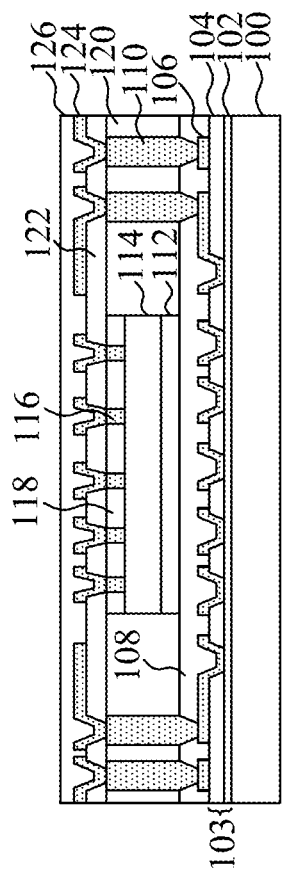

A fifth insulating material 126 is formed over the patterned second conductive material 124 and the patterned fourth insulating material 122, as shown in FIG. 16. The fifth insulating material 126 is also referred to herein, e.g., in some of the claims, as a fourth insulating material 126. The fifth insulating material 126 comprises a portion of the second RDL 134. The fifth insulating material 126 comprises a material and thickness similar to the material and thickness of the second layer 104 described herein of the first insulating material 103, for example. Alternatively, the fifth insulating material 126 may comprise other materials and dimensions.

Figure 17:
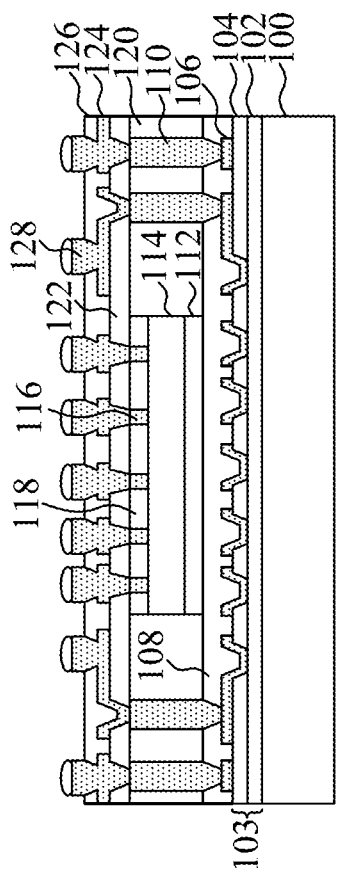

The fifth insulating material 126 is patterned using lithography, as shown in FIG. 17. The fifth insulating material 126 is patterned to expose portions of the second conductive material 124 in a perimeter region and a central region of the fifth insulating material 126. The exposed portions of the fifth conductive material 126 comprise landing regions or contact pads in some embodiments.

Next, a plurality of conductive bumps 128 are coupled to the second RDL 134, e.g., to the exposed portions of the second conductive material 124, through the patterned fifth insulating material 126, as shown in FIG. 17. The plurality of conductive bumps 128 comprises solder bumps or controlled collapse chip connection (C4) bumps in some embodiments, as examples. The conductive bumps 128 may comprise Cu, a Cu alloy, and/or solder and some may include a metal pillar, for example. Alternatively, the conductive bumps 128 may comprise other types of contacts or external connections, and the conductive bumps 128 may comprise other materials.

Figure 18:
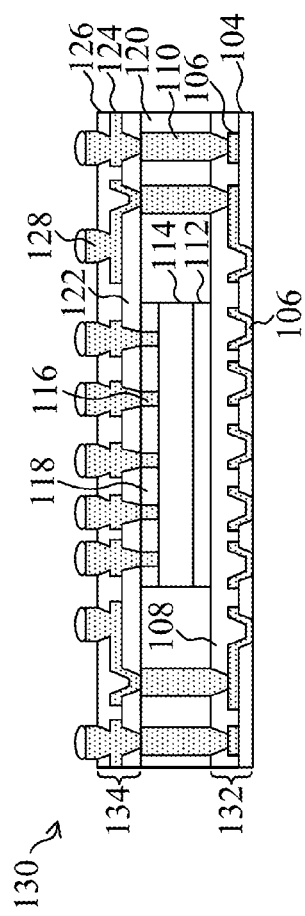
Figure 19:
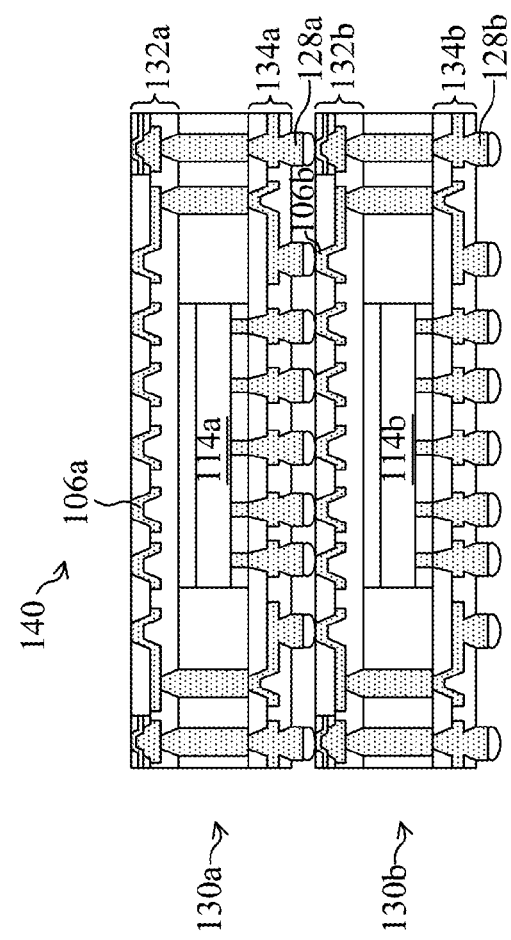
FIG. 19 is a cross-sectional view of a PoP device in accordance with an embodiment.

Next, the carrier 100 is removed, as shown in FIG. 18, which illustrates a cross-sectional view of a packaged semiconductor device 130 that includes the integrated circuit die 114 in accordance with an embodiment. If included in the first insulating material 103, the first layer 102 of the first insulating material 103 is also removed. The first insulating material 103, the first conductive material 106, and the second insulating material 108 comprise a first RDL 132 in accordance with some embodiments of the present disclosure. The fourth insulating material 122, the second conductive material 124, and the fifth insulating material 126 comprise a second RDL 134 in accordance with some embodiments.

The molding compound 120 is disposed between the first RDL 132 and the second RDL 134. The TAVs 110 couple the first RDL 132 to the second RDL 134 and provide vertical electrical connections for the packaged semiconductor device 130. The first RDL 132 and the second RDL 134 provide horizontal electrical connections for the packaged semiconductor device 130.

The TAVs 110 are shown in FIGS. 1 through 18 as being arranged in two rows on each side of the packaged semiconductor device 130. Alternatively, the TAVs 110 may be arranged in other numbers of rows, and the TAVs 110 may be formed along the entire perimeter of the packaged semiconductor device 130 in a top view, in some embodiments. The TAVs 110 may be arranged in a single row in a perimeter of the packaged semiconductor device 130, or the TAVs 110 may be arranged in three or more rows in the perimeter of the packaged device 130. The conductive bumps 128 may be arranged in an array pattern, in one or more rows along the perimeter, or in other or in random arrangements in a top or bottom view of the packaged semiconductor device 130, for example. Exposed portions of first conductive material 106 of the first RDL 132 may also be arranged in an array pattern, in one or more rows along the perimeter, or in other or in random arrangements in a top or bottom view of the packaged semiconductor device 130, as another example.

The deposition methods used for the various material layers of the packaged semiconductor device 130 comprise methods typically used for semiconductor manufacturing and packaging process. As examples, chemical vapor deposition (CVD), plasma-enhanced CVD (PECVD), sputtering, spin-on, and plating techniques may be used to form the various material layers of the packaged semiconductor device 130, as appropriate for the type of material being formed, as examples. Alternatively, other methods may be used to deposit or form the various material layers described herein.

In FIGS. 1 through 17, only one integrated circuit 114 is illustrating being packaged over the carrier 100. Alternatively, a plurality of integrated circuits 114 can be packaged over the carrier 100, and before or after the carrier 100 is removed, the packaged semiconductor devices 130 are singulated along scribe lines into a plurality of packaged semiconductor devices 130.

FIG. 19 is a cross-sectional view of a PoP device 140 in accordance with an embodiment. Two of the packaged semiconductor devices 130 (e.g., shown as packaged semiconductor devices 130a and 130b in FIG. 19) shown in FIG. 18 can be coupled together in accordance with an embodiment in a package-on-package (PoP) configuration. Conductive bumps 128a coupled to a second RDL 134a of packaged semiconductor device 130a are coupled to exposed portions of first conductive material 106b of first RDL 132b of packaged semiconductor device 130b in the embodiment shown in FIG. 19.

For example, in FIG. 19, a first packaged semiconductor device 130a comprises a packaged first integrated circuit die 114a, and a second packaged semiconductor device 130b comprises a packaged second integrated circuit die 114b. The second packaged semiconductor device 130b is coupled to the plurality of conductive bumps 128a coupled to the second RDL 134a of the first packaged semiconductor device 130a.

Portions of the first conductive material 106a and 106b are exposed both in a perimeter region and also a central region of the first RDLs 132a and 132b of the packaged semiconductor devices 130a and 130b, respectively, in accordance with some embodiments, which is also illustrated in FIG. 19.

Three or more packaged semiconductor devices 130, 130a, and 130b can be vertically stacked and coupled together using the conductive bumps 128, 128a, and 128b and first RDLs 132, 132a, and 132b in accordance with some embodiments. For example, in FIG. 19, an additional packaged semiconductor device 130 can be coupled to the conductive bumps 128b of packaged semiconductor device 130b or coupled to the exposed first conductive material 106a of the first RDL 132a of packaged semiconductor device 130a.

In FIG. 19, two of the packaged semiconductor devices 130, 130a, and 130b are coupled together to form the PoP device 140. Alternatively, a packaged semiconductor device 130, 130a, and 130b described herein can be coupled to another type of packaged semiconductor device. For example, integrated circuit dies that are mounted on a substrate in a flip chip fashion or mounted on a substrate using wire bonds can be coupled to a packaged semiconductor device 130, 130a, and 130b, using the conductive bumps 128, 128a, 128b or the first RDL 132, 132a, or 132b, respectively. Alternatively, the packaged semiconductor devices 130, 130a, and 130b described herein can be coupled to integrated circuit dies packaged in other types of packaging to form 3DICs and other vertically stacked integrated circuit structures.

Figure 20:
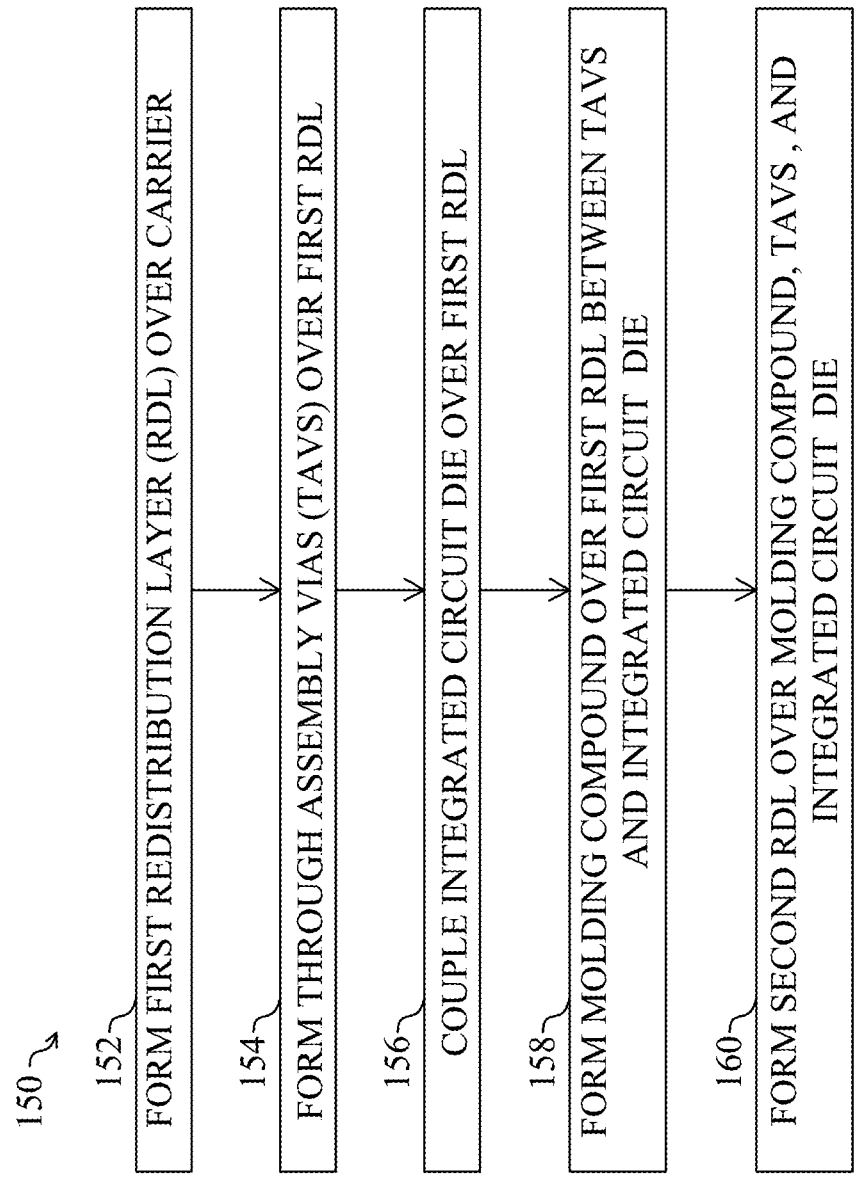
FIG. 20 is a flow chart illustrating a method of packaging an integrated circuit die in accordance with an embodiment.

FIG. 20 is a flow chart 150 illustrating a method of packaging an integrated circuit die 114 in accordance with an embodiment. In step 152, a first RDL 132 is formed over a carrier 100. In step 154, a plurality of TAVs 110 is formed over the first RDL 132. In step 156, an integrated circuit die 114 is coupled over the first RDL 132. A molding compound 120 is formed over the first RDL 132 between the TAVs 110 and the integrated circuit die 114 in step 158. The molding compound 120 is also formed between the plurality of TAVs 110. A second RDL 134 is formed over the molding compound 120, the TAVs 110, and the integrated circuit die 114 in step 160.

Embodiments of the present disclosure include methods of packaging semiconductor devices, and also include packaged semiconductor devices that are packaged using the methods described herein. Embodiments of the present disclosure also include PoP devices including the packaged semiconductor devices described herein.

Advantages of embodiments of the disclosure include providing novel packaging devices and methods that provide stream-lined methods of packaging semiconductor devices that require fewer steps in the packaging process flow. An innovative 3D package-on-package structure is provided with a decreased number of processing steps. The packaging techniques described herein are low in cost and have high yields, due to the simplified process flow. The novel packaging structures and designs are easily implementable in packaging process flows, and may be used to package many types of integrated circuits. The novel packaging methods and structures advantageously require the use of only one carrier 100.

In accordance with one embodiment of the present disclosure, a method of packaging a semiconductor device includes forming a first RDL over a carrier, and forming a plurality of TAVs over the first RDL. An integrated circuit die is coupled over the first RDL, and a molding compound is formed over the first RDL, the TAVs, and the integrated circuit die. A second RDL is formed over the molding compound, the TAVs, and the integrated circuit die.

In accordance with another embodiment, a method of packaging a semiconductor device includes forming a first insulating material over a carrier, patterning the first insulating material, and forming a first conductive material over the patterned first insulating material. The method includes patterning the first conductive material, forming a second insulating material over the patterned first conductive material and the patterned first insulating material, and patterning the second insulating material to expose portions of the first conductive material in a perimeter region of the second insulating material. A plurality of TAVs is formed over the exposed portions of the first conductive material in the perimeter region of the second insulating material. An integrated circuit die is coupled over the second insulating material in a central region of the second insulating material, and a molding compound is formed over the second insulating material between the plurality of TAVs and the integrated circuit die. A third insulating material is formed over the plurality of TAVs, the integrated circuit die, and the second insulating material. The third insulating material is patterned, and a second conductive material is formed over the patterned third insulating material. The method includes patterning the second conductive material, forming a fourth insulating material over the patterned second conductive material and the patterned third insulating material, and patterning the fourth insulating material to expose portions of the second conductive material. A plurality of conductive bumps is formed over the exposed portions of the second conductive material, and the carrier is removed.

In accordance with yet another embodiment, a packaged semiconductor device includes a first RDL, an integrated circuit die disposed over a central region of the first RDL, and a DAF or an adhesive disposed between the first RDL and the integrated circuit die. A second RDL is disposed over and electrically coupled to the integrated circuit die. A molding compound is disposed between the first RDL and the second RDL, and a plurality of TAVs is disposed in the molding compound in a perimeter region of the first RDL.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging a semiconductor device, the method comprising:
    forming a first redistribution layer (RDL) over a carrier by
        forming a first insulating material over a carrier,
        patterning the first insulating material,
        forming a first conductive material over the patterned first insulating material, patterning the first conductive material, and forming a second insulating material over the patterned first conductive material and the patterned first insulating material;
forming a plurality of through assembly vias (TAVs) over the first RDL by
patterning the second insulating material to expose portions of the first conductive material in a perimeter region of the second insulating material, and
forming the TAVs over the exposed portions of the first conductive material;
coupling an integrated circuit die over the first RDL, a first side of the integrated circuit die coupled to the first RDL, the integrated circuit die having contacts disposed at and extending above a second side of the integrated circuit die opposite the first side;
forming a molding compound over the first RDL, the TAVs, and around the integrated circuit die;
forming a second RDL over the molding compound, the TAVs, and the integrated circuit die by
forming a third insulating material over the plurality of TAVs, the integrated circuit die, and the second insulating material,
patterning the third insulating material,
forming a second conductive material over the patterned third insulating material,
patterning the second conductive material to form at least one conductive element, at least a first conductive element of the second conductive material in contact with a first one of the contacts, and
forming a fourth insulating material over the patterned second conductive material and the patterned third insulating material;
wherein the second RDL includes a plurality of second conductive elements each having a contact pad configured to accept a conductive bump thereon and disposed within a second dielectric, first ones of the plurality of second conductive elements each connected to respective ones of the contacts, a first contact pad of at least one of the first ones of the second conductive elements aligned directly over and electrically connected with a respective one of the contacts; and
forming a conductive bump on the first contact pad by patterning the fourth insulating material to expose portions of the second conductive material, at least a first exposed portion of the second conductive material aligned directly over the integrated circuit die, and forming a plurality of conductive bumps over the exposed portions of the second conductive material, at least one of the plurality of conductive bumps disposed on the first exposed portion, wherein the conductive bump is aligned directly over the integrated circuit die.

2. The method according to claim 1, wherein coupling the integrated circuit die over the first RDL comprises attaching the integrated circuit die to the first RDL using a die attach film (DAF) or an adhesive.

3. The method according to claim 1, further comprising coupling a plurality of conductive bumps to the second RDL.

4. The method according to claim 1, wherein coupling the integrated circuit die over the first RDL comprises coupling an integrated circuit die including a plurality of contacts disposed within an insulating material on a surface thereof during the coupling, and wherein the forming the molding compound comprises forming the molding compound without the molding compound overlying the integrated circuit die.

5. The method according to claim 1, wherein forming the plurality of TAVs comprises plating the plurality of TAVs over portions of the first RDL.

6. The method according to claim 5, wherein forming the plurality of TAVs comprises forming the plurality of TAVs in a perimeter region of the first RDL.

7. The method according to claim 6, wherein coupling the integrated circuit die over the first RDL comprises coupling the integrated circuit die to a central region of the first RDL.

8. The method according to claim 1, further comprising mounting a package on the first RDL, the package having one or more conductive bumps disposed thereon, the mounting of the package comprising connecting the conductive bumps of the package to the first conductive elements of the first RDL.

9. A method of packaging a semiconductor device, the method comprising:
forming a first insulating material over a carrier;
patterning the first insulating material;
forming a first conductive material over the patterned first insulating material;
patterning the first conductive material;
forming a second insulating material over the patterned first conductive material and the patterned first insulating material;
patterning the second insulating material to expose portions of the first conductive material in a perimeter region of the second insulating material;
forming a plurality of through assembly vias (TAVs) over the exposed portions of the first conductive material in the perimeter region of the second insulating material;
coupling an integrated circuit die over the second insulating material in a central region of the second insulating material, the integrated circuit die having contacts disposed on a first side;
forming a molding compound over the second insulating material between the plurality of TAVs and the integrated circuit die;
forming a third insulating material over the plurality of TAVs, the integrated circuit die, and the second insulating material;
patterning the third insulating material;
forming a second conductive material over the patterned third insulating material;
patterning the second conductive material to form at least one conductive element, at least a first conductive element of the second conductive material in contact with a first one of the contacts;
forming a fourth insulating material over the patterned second conductive material and the patterned third insulating material;
patterning the fourth insulating material to expose portions of the second conductive material, at least a first exposed portion of the second conductive material aligned directly over the integrated circuit die;
forming a plurality of conductive bumps over the exposed portions of the second conductive material, at least one of the plurality of conductive bumps disposed on the first exposed portion;
removing the carrier; and
mounting a package having one or more conductive bumps disposed thereon over the first insulating material by connecting the conductive bumps of the package to the first conductive material.

10. The method according to claim 9, wherein forming the molding compound over the second insulating material between the plurality of TAVs and the integrated circuit die comprises forming the molding compound over top surfaces of the plurality of TAVs and over a top surface of the integrated circuit die, and wherein the method further comprises removing the molding compound from over the top surfaces of the plurality of TAVs and from over the top surface of the integrated circuit die.

11. The method according to claim 10, wherein removing the molding compound from over the top surfaces of the plurality of TAVs and from over the top surface of the integrated circuit die comprises a chemical mechanical polishing (CMP) process, an etch process, or a combination thereof.

12. The method according to claim 9, wherein forming the first insulating material, forming the second insulating material, forming the third insulating material, or forming the fourth insulating material comprises forming a material selected from the group consisting essentially of a polyimide, a polymer, polybenzoxazole (PBO), and combinations thereof.

13. The method according to claim 9,
wherein coupling the integrated circuit die over the second insulating material comprises coupling an integrated circuit die including a plurality of contacts on a first surface of the integrated circuit die, a second surface opposite the first surface of the integrated circuit nearest the second insulating material;
wherein the forming of the second conductive material comprises forming at least a first conductive element of the second conductive material in contact with a first contact of the plurality of contacts; and
wherein forming a plurality of conductive bumps comprises forming a first one of the conductive bumps aligned directly over the first one of the contacts and in electrical contact with the first contact through the first conductive element.

14. The method according to claim 13, wherein patterning the third insulating material comprises exposing the plurality of contacts on the surface of the integrated circuit die, and wherein forming the second conductive material over the patterned third insulating material comprises coupling portions of the second conductive material to the plurality of contacts on the surface of the integrated circuit die.

15. A packaged semiconductor device, comprising:
a first redistribution layer (RDL), including a patterned first insulating layer, a patterned first conductive material formed over the patterned first insulating layer, and a second insulating material formed over the patterned first conductive material and the patterned first insulating layer;
an integrated circuit die disposed over a central region of the first RDL, wherein a first side of the integrated circuit die is nearest the first RDL, the integrated circuit die having contacts disposed on a second side of the integrated circuit die opposite the first side;
a die attach film (DAF) or an adhesive disposed between the first RDL and the integrated circuit die;
a second RDL disposed over and electrically coupled to the integrated circuit die, the second RDL including a patterned third insulating material and a patterned second conductive material over the patterned third insulating material, and a fourth insulating material over the patterned second conductive material and the patterned third insulating material, wherein the fourth insulating material exposes a portion of the patterned second conductive material directly over the integrated circuit die, the second RDL having a plurality of conductive elements with contact pads configured to accept conductive bumps and disposed within a dielectric, first contact pads of the plurality of conductive elements each connected to respective ones of the contacts, at least one of the first contact pads aligned directly over and in electrical contact with a respective one of the contacts;
at least one conductive bump being disposed on the exposed portion of the patterned second conductive material and aligned directly over the integrated circuit die, the at least one conductive bump disposed on the at least one of the first contact pads;
a molding compound disposed between the first RDL and the second RDL; and
a plurality of through assembly vias (TAVs) disposed in the molding compound in a perimeter region of the first RDL.

16. The packaged semiconductor device according to claim 15, wherein the molding compound is disposed around the integrated circuit die.

17. The packaged semiconductor device according to claim 15, wherein the at least one conductive bump comprises a solder bump or a controlled collapse chip connection (C4) bump.

18. A package on package (PoP) device including the packaged semiconductor device according to claim 15.

19. The PoP device according to claim 18, wherein the packaged semiconductor device comprises a first packaged semiconductor device, and wherein the integrated circuit die comprises a first integrated circuit die, the packaged semiconductor device further comprising a second packaged semiconductor device including a second integrated circuit die coupled to the at least one conductive bump.

20. The PoP device according to claim 19, wherein the conductive bumps of the second packaged semiconductor device are mounted to the first RDL of the first packaged semiconductor device.

* * * * *